United States Patent [19]
Oyama

[11] Patent Number: 5,337,201
[45] Date of Patent: Aug. 9, 1994

[54] INFORMATION SIGNAL OUTPUT APPARATUS WITH AMPLITUDE CONTROL HAVING SELECTED SPEED RESPONSE

[75] Inventor: Eiji Oyama, Yokohama, Japan

[73] Assignee: Canon Kabushiki Kaisha, Tokyo, Japan

[21] Appl. No.: 901,027

[22] Filed: Jun. 19, 1992

[30] Foreign Application Priority Data

Jul. 9, 1991 [JP] Japan .................................. 3-168314

[51] Int. Cl.$^5$ .......................... G11B 5/02; H04N 9/79; H03G 3/20; H03G 3/10
[52] U.S. Cl. ....................................... 360/68; 358/315; 330/141; 330/281
[58] Field of Search ..................... 360/68, 67, 61, 64, 360/65, 46; 358/315, 318, 174, 327; 455/297; 330/281, 141

[56] References Cited

U.S. PATENT DOCUMENTS

| | | | |
|---|---|---|---|
| 429,598 | 9/1981 | Yasumura | 330/281 |
| 4,422,049 | 12/1983 | Akagiri et al. | 330/141 X |
| 4,521,738 | 6/1985 | Akagiri et al. | 330/141 X |
| 5,121,076 | 6/1992 | Lendaro | 330/141 |
| 5,138,277 | 8/1992 | Robinson et al. | 330/281 |

Primary Examiner—Donald Hajec
Assistant Examiner—Patrick Wamsley
Attorney, Agent, or Firm—Fitzpatrick, Cella, Harper & Scinto

[57] ABSTRACT

An information signal output apparatus is adapted, when controlling the amplitude of an input information signal to be a predetermined level, to control the speed of response of the amplitude control in accordance with the status of the input information signal. The apparatus is thereby able to output an input information signal without deteriorating the signal.

12 Claims, 2 Drawing Sheets

INFORMATION SIGNAL OUTPUT APPARATUS WITH AMPLITUDE CONTROL HAVING SELECTED SPEED RESPONSE

BACKGROUND OF THE INVENTION

1. Field of the Invention

The present invention relates to information signal output apparatus.

2. Related Background Art

An information signal output apparatus, for example, an information signal reproduction apparatus such as a video tape player, has been known for reproducing an information signal recorded on a recording medium.

In recent years, various efforts have been made to reduce the size and weight of video tape players. These efforts have resulted in the advent of, for example, an apparatus having a plurality of magnetic heads provided on a small-diameter rotary drum. The plurality of magnetic heads are sequentially interchanged in order to reproduce a video or audio signal recorded on a magnetic tape.

A conventional video tape player includes an automatic gain control (AGC) circuit for controlling the level of a reproduction signal reproduced by the magnetic heads to be a predetermined level. The AGC circuit is provided, for example, in an early or intermediate stage of a circuit for sequentially switching that sequentially switches the plurality of magnetic heads. While the head switch effects sequential switching, a reproduction signal, whose level has been controlled to be a predetermined level by the AGC circuit, is output. The output signal is supplied to a reproduction signal processing circuit or the like.

The speed at which the AGC circuit of a conventional video tape player responds is not very high. This ensures stable control of the signal level. As a result, however, there is the risk that, when the head switch effects switching, a whisker-shaped noise is generated in the reproduction signal, thereby deteriorating the signal.

SUMMARY OF THE INVENTION

The present invention is directed to providing information signal output apparatus capable of overcoming the above problem.

The present invention is also directed to information outputting apparatus in which an information signal is applied to an amplitude control device having a controlled speed of response.

It is an object of the present invention to provide an information signal output apparatus capable of outputting an input information signal without signal deterioration.

In order to achieve the above object, according to an embodiment of the present invention, there is provided an information signal output apparatus for outputting an information signal, including: an amplitude control for inputting an information signal, and for controlling the amplitude of the information signal to be a predetermined level; and a response speed control for controlling, in accordance with the status of the information signal with respect to the information signal inputting of the amplitude control, the speed of response of the amplitude control.

It is another object of the present invention to provide an information signal output apparatus capable of outputting an information signal reproduced from a recording medium without signal deterioration.

In order to achieve this object, according to another embodiment of the present invention, there is provided an information signal output apparatus for reproducing an information signal recorded on a recording medium, and for outputting the information signal, including: a head for reproducing and then outputting an information signal recorded on a recording medium; an amplitude control for inputting the information signal output from the head, and for controlling the amplitude of the information signal to be a predetermined level; and a response speed control for controlling, in accordance with the status of the information signal with respect to the information signal reproducing of the head, the speed of response of the amplitude control.

It is a further object of the present invention to provide an information signal reproduction apparatus capable of outputting an information signal reproduced from a tape-shaped magnetic recording medium without signal deterioration.

In order to achieve this further object, according to a further embodiment of the present invention, there is provided an information signal reproduction apparatus for reproducing an information signal recorded on a tape-shaped magnetic recording medium, and for outputting the information signal, including: a rotary head having a plurality of magnetic head groups, the head tracing a tape-shaped magnetic recording medium with the plurality of magnetic head groups to reproduce an information signal recorded on the recording medium; a first amplitude control for inputting an information signal reproduced by a first magnetic head group of the rotary head, for controlling the amplitude of the information signal to be a predetermined level, and for outputting a first resultant information signal; a second amplitude control for inputting an information signal reproduced by a second magnetic head group of the rotary head, for controlling the amplitude of the information signal to be the predetermined level, and for outputting a second resultant information signal; an information signal output for selecting one magnetic head group from among a plurality of magnetic head groups of the rotary head, and for outputting the information signal which has been reproduced by the selected magnetic head group from the tape-shaped magnetic recording medium, and the amplitude of which has been controlled to be the predetermined level; and a response speed control for controlling, in accordance with the status of the plurality of magnetic head groups of the rotary head with respect to a head selection of the information signal output, the speed of response of the first and second amplitude controls.

The above and other objects and the features of the present invention will be apparent from the following detailed description of embodiments of the present invention with reference to the accompanying drawings.

DETAILED DESCRIPTION OF THE PREFERRED EMBODIMENTS

The present invention will now be described with respect to embodiments thereof.

Figure 1:
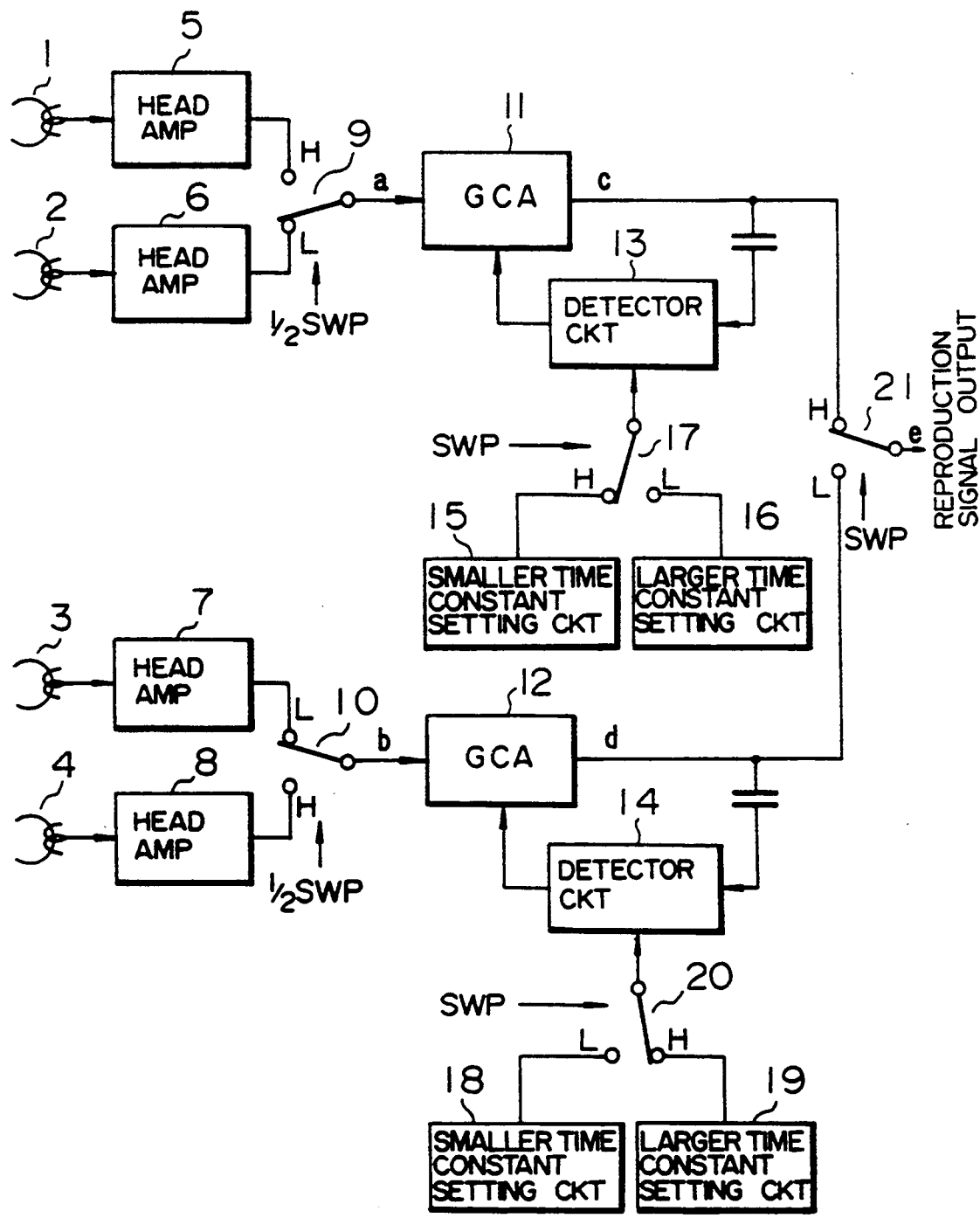
FIG. 1 is a diagram schematically showing the essential construction of an image signal reproduction apparatus to which the present invention is applied.

Referring to FIG. 1, an image signal reproduction apparatus to which the present invention is applied has a plurality of magnetic heads 1 to 4, and head amplifiers (HEAD AMPs) 5 to 8. Head switches 9 and 10 are provided to cause signals output from the head amplifiers 5 to 8 to sequentially be interchanged with each other so that these signals are interchangingly output from the head section of the apparatus. The apparatus also has first and second gain control amplifiers (GCAs) 11 and 12 for amplifying reproduction signals output through the head switches 9 and 10, respectively. The first and second GCAs 11 and 12 are associated with detector circuits 13 and 14, respectively, for detecting the respective signals output from the GCAs 11 and 12, and for controlling the respective gains of the GCAs 11 and 12. The apparatus includes time constant setting circuits 15 and 16 for setting the time constant of the detector circuit 13, and a changeover switch 17 for selectively connecting one of the time constant setting circuits 15 and 16 to the detector circuit 13. Similarly, the detector circuit 14 is associated with time constant setting circuits 18 and 19 for setting the time constant of the detector circuit 14, and a changeover switch 20 for selectively connecting one of the time constant setting circuits 18 and 19 to the detector circuit 14. The signal outputs of the first and second GCAs 11 and 12 are interchangingly output through a switch 21.

The time constant setting circuit 16 is able to set a larger time constant than the time constant setting circuit 15, and to hold the gain of the first GCA 11 for a predetermined period of time. Similarly, the time constant setting circuit 19 is able to set a larger time constant than the time constant setting circuit 18, and to hold the gain of the second GCA 12 for a predetermined period of time.

In the head section, a signal already recorded on a magnetic tape (not shown) is reproduced by the magnetic heads 1 to 4, amplified by the head amplifiers 5 to 8, and supplied to the head switches 9 and 10.

The switching operation of the head switches 9 and 10 is controlled by a head switching control signal ½ SWP (shown in FIG. 2) output by a system controller, not shown. When the head switching control signal ½ SWP is at a high level, each of the head switches 9 and 10 is connected to an H terminal (shown in FIG. 1), whereas, when the signal ½ SWP is at a low level, each head switch 9 or 10 is connected to an L terminal (shown in FIG. 1). As a result, the head switch 9 outputs a reproduction signal a, such as that shown in FIG. 2, while the head switch 10 outputs a reproduction signal b, also shown in FIG. 2.

The reproduction signals output through the head switches 9 and 10 are respectively supplied to the first and second GCAs 11 and 12. The signals output by GCAs 11 and 12 are respectively detected by the detector circuits 13 and 14. Each detector circuit 13 or 14 controls, in accordance with the level of the detected signal, the gain of the GCA 11 or 12 in such a manner that the envelope of the output signal of the GCA 11 or 12 has a predetermined level.

As shown in Fig, 2, the levels of the reproduction signal envelope output through the head switches 9 and 10 are not constant. As a result, during a period of time in which a reproduction signal has no envelope, the associated GCA 11 or 12 may produce a full gain.

In order to avoid this phenomenon, in this embodiment of the present invention, the time constant setting circuits 15 and 16, the changeover switch 17, the time constant setting circuits 18 and 19, and the changeover switch 20 are provided. Specifically, the switching operation of the changeover switch 17 (between the two time constant setting circuits 15 and 16 connectable with the detector circuit 13 to set the time constant of the circuit 13) is controlled on the basis of a connection switching control signal SWP (shown in FIG. 2) output by the system controller in the following manner: when the connection switching control signal SWP is at the high level (i.e., when the reproduction signal output through the head switch 9 has an envelope), the changeover switch 17 is connected to an H terminal (shown in FIG. 1) so that the time constant setting circuit 15 sets the time constant with which the detector circuit 13 operates; and when the connection switching control signal SWP is the low level (i.e., when the reproduction signal output through the head switch 9 has no envelope), the changeover switch 17 is connected to an L terminal (shown in FIG. 1) so that the time constant setting circuit 16 sets the time constant with which the detector circuit 13 operates. By virtue of the above control, when the reproduction signal output from the head switch 9 lacks an envelope, the gain of the first GCA 11 is held at the gain before the switching action of the changeover switch 17. Further, the switching operation of the changeover switch 20 (between the two time constant setting circuits 18 and 19 connectable with the detector circuit 14 to set the time constant of the circuit 14) is controlled on the basis of the connection switching control signal SWP (shown in FIG. 2) in the following manner: when the connection switching control signal SWP is at the low level (i.e., when the reproduction signal output through the head switch 10 has an envelope), the changeover switch 20 is connected to an L terminal (shown in FIG. 1) so that the time constant setting circuit 18 sets the time constant with which the detector circuit 14 operates; and when the connection switching control signal SWP is at the high level (i.e., when the reproduction signal output through the head switch 10 has no envelope), the changeover switch 20 is connected to an H terminal (shown in FIG. 1) so that the time constant setting circuit 19 sets the time constant with which the detector circuit 14 operates. By virtue of the above control, when the reproduction signal output from the head switch 10 lacks an envelope, the gain of the second GCA 12 is held at the gain before the switching action of the changeover switch 20.

Figure 2:
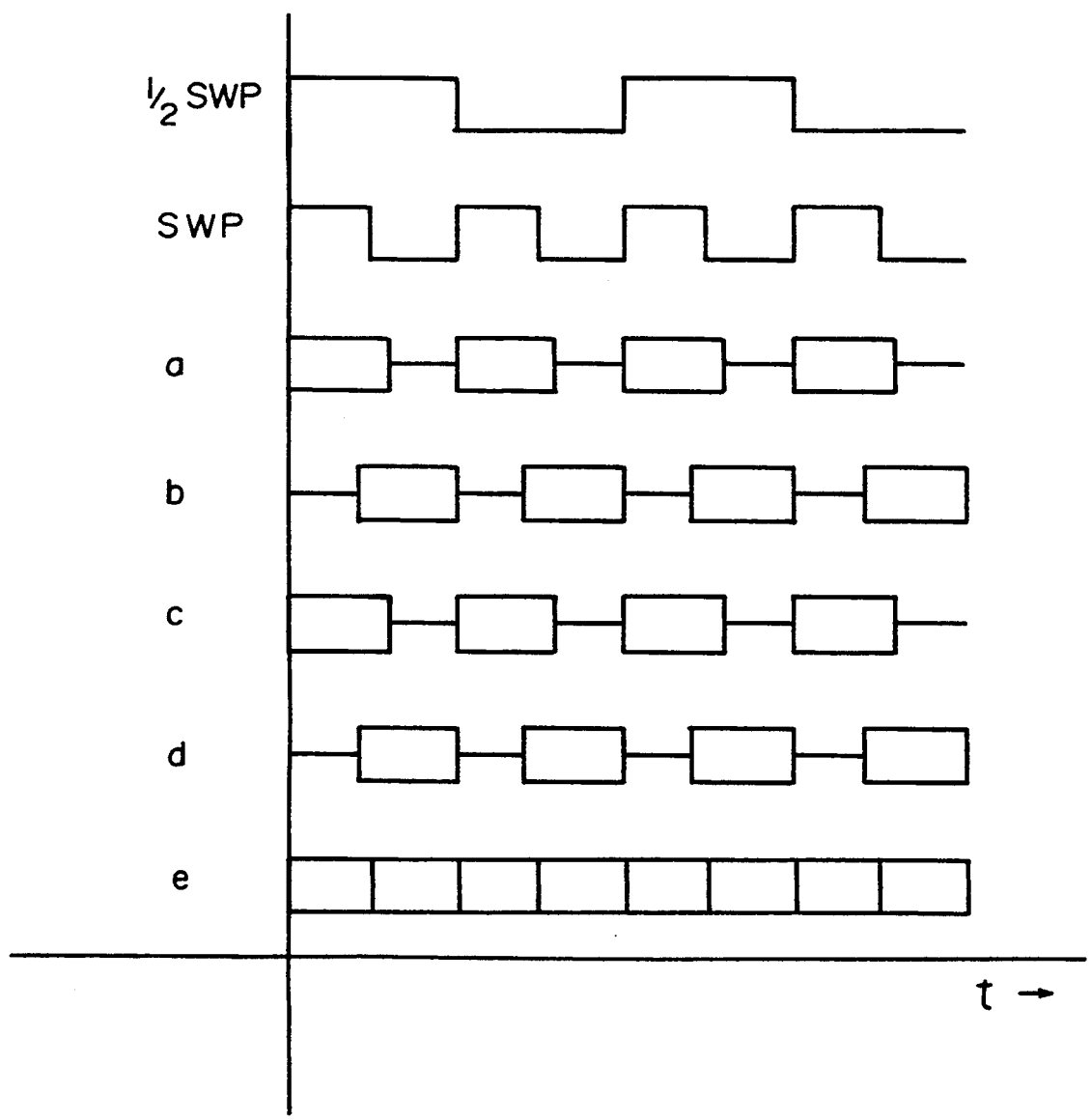
FIG. 2 is a timing chart showing the waveform of signals at various parts of the construction shown in FIG. 1.

Holding the gain, as described above, makes it possible for the first and second GCAs 11 to 12 to respectively output reproduction signals c and d (shown in FIG. 2). No whisker-shaped noise is generated in the reproduction signals c and d, and their envelopes are maintained at a predetermined level.

The interchanging between the respective reproduction signals output from the first and second GCAs 11 and 12 is controlled on the basis of the connection switching control signal SWP. Specifically, the switch 21 is connected to an H terminal (the state shown in FIG. 1) when the SWP is at the high level, whereas it is connected to an L terminal when the SWP is at the low level. Such switching action of the switch 21 causes the reproduction signals from GCAs 11 and 12 to be interchangingly output. Hence, a reproduction signal e, shown in FIG. 2, is continuously output.

As described above, a first pair of time constant setting circuits 15 and 16 and a second pair of time constant setting circuits 18 and 19 are provided for setting the respective time constants of the detector circuits 13 and 14, and the time constant setting circuits in each pair are switched in such a manner that, in the period of time during which the reproduction signal supplied to the associated GCA 11 or 12 has no envelope, the gain of the particular GCA is held at a certain level. This makes it possible to output a reproduction signal while preventing generation of whisker-shaped noise in the reproduction signal and maintaining the envelope of the reproduction signal at a predetermined level, that is, without deteriorating the reproduction signal.

Thus, according to the present invention, it is possible to attain an information signal output apparatus having a simple construction for enabling an information signal to be output without being deteriorated. plurality of magnetic head groups include two magnetic head groups, each group including two magnetic heads.

What is claimed is:

1. An information signal output apparatus for outputting an information signal, comprising:
   (A) amplitude control means for inputting an information signal intermittently and controlling the amplitude of said information signal to be a predetermined level; and
   (B) response speed control means for controlling, in accordance with the status of said information signal with respect to the information signal inputting of said amplitude control means, the speed of response of said amplitude control means.

2. An apparatus according to claim 1, wherein said amplitude control means includes:
   (a) a gain control amplifier for amplifying said input information signal, and for outputting a resultant information signal;
   (b) a detecting circuit for holding said resultant information signal output from said gain control amplifier;
   (c) and for detecting said held resultant information signal, and for controlling, in accordance with a level of said detected signal, the gain of said gain control amplifier; and
   said response speed control means includes:
   a plurality of time constant setting circuits each for setting a time constant of said detecting circuit to one of a plurality of different time constants.

3. An apparatus according to claim 2, wherein said response speed control means causes, in accordance with the status of said information signal with respect to the information signal inputting of said gain control amplifier, one of said plurality of time constant setting circuits to set the time constant of said detecting circuit.

4. An apparatus according to claim 2, wherein said response speed control means is arranged to select, when no information signal is input to said gain control amplifier, a particular time constant setting circuit from among said plurality of time constant setting circuits, said particular time constant setting circuit setting the time constant of said detecting circuit to a time constant larger than a time constant set when an information signal is input to said gain control amplifier.

5. An information signal reproduction apparatus for reproducing an information signal recorded on a recording medium, and for outputting the information signal, comprising:
   (A) head means for reproducing an information signal recorded on the recording means intermittently and outputting said information signal;
   (B) amplitude control means for inputting said information signal output from said head means, and for controlling the amplitude of said information signal to be a predetermined level; and
   (C) response speed control means for controlling, in accordance with the status of said information signal with respect to the information signal reproducing of said head means, the speed of response of said amplitude control means.

6. An apparatus according to claim 5, wherein said amplitude control means includes:
   (a) a gain control amplifier for amplifying said information signal, and for outputting a resultant information signal; and
   (b) a detecting circuit for holding said resultant information signal output from said gain control amplifier;
   (c) and for detecting said held resultant information signal, and for controlling, in accordance with a level of said detected signal, the gain of said gain control amplifier; and
   said response speed control means includes:
   a plurality of time constant setting circuits each for setting a time constant of said detecting circuit to one of a plurality of different time constants.

7. An apparatus according to claim 6, wherein said response speed control means causes, in accordance with the status of said information signal with respect to the information signal outputting of said head means, one of said plurality of time constant setting circuits to set the time constant of said detecting circuit.

8. An apparatus according to claim 6, wherein said response speed control means is arranged to select, when no information signal is output by said head means, a particular time constant setting circuit from among said plurality of time constant setting circuits, said particular time constant setting circuit setting the time constant of said detecting circuit to a time constant larger than a time constant set when an information signal is output by said head means.

9. An information signal reproduction apparatus for reproducing an information signal recorded on a tape-shaped magnetic recording medium, and for outputting the information signal, comprising:
   (A) rotary head means having a plurality of magnetic head groups, for reproducing an information signal recorded on a tape-shaped magnetic recording medium by tracing a tape-shaped magnetic recording medium intermittently by said plurality of magnetic head groups, and outputting said information signal.
   (B) first amplitude control means for inputting a first information signal reproduced by a first magnetic head group of said rotary head means, for controlling the amplitude of said first information signal to be a predetermined level, and for outputting a first resultant information signal;
   (C) second amplitude control means for inputting an second information signal reproduced by a second magnetic head group of said rotary head means, for controlling the amplitude of said second information signal to be the predetermined level, and for outputting a second resultant information signal;

(D) selecting means for selecting one magnetic head group from among said plurality of magnetic head groups of said rotary head means; and (E) response speed control means for controlling, in accordance with the status of selection by said selecting means, the speed of response of said first and second amplitude control means.

10. An apparatus according to claim 9, wherein each of said first and second amplitude control means includes:

(a) a gain control amplifier for amplifying said information signal, and for outputting a resultant information signal;

(b) a detecting circuit for holding said resultant information signal output from said gain control amplifier;

(c) and for detecting said held resultant information signal, and for controlling, in accordance with a level of said detected signal, a gain of said gain control amplifier; and said response speed control means includes:

a plurality of time constant setting circuits each for setting a time constant of said detecting circuit to one of a plurality of different time constants.

11. An apparatus according to claim 10, wherein said response speed control means causes, in accordance with the status of selection by said selecting means, one of said plurality of time constant setting circuits to set the time constant of said detecting circuit.

12. An apparatus according to claim 10, wherein said response speed control means is arranged to select, when said first or second amplitude control means connected to a non-selected magnetic head group which is not selected by said selecting means, a particular time constant setting circuit among said plurality of time constant setting circuits, said particular time constant setting circuit setting the time constant of the detecting circuit to a time constant larger than a time constant set when said first or second amplitude control means connected to a selected magnetic head group which is selected by said selecting means.

* * * * *

UNITED STATES PATENT AND TRADEMARK OFFICE
CERTIFICATE OF CORRECTION

PATENT NO. : 5,337,201
DATED : August 9, 1994
INVENTOR(S) : EIJI OYAMA

Page 1 of 2

It is certified that error appears in the above-identified patent and that said Letters Patent is hereby corrected as shown below:

TITLE PAGE:

AT [56] REFERENCES CITED

U.S. Patent Documents,
    "429,598 9/1981 Yasumura" should read
    --4,292,598 9/1981 Yasumura--.

COLUMN 1

Line 28, "for sequentially switching" should be deleted.

COLUMN 5

Line 20, "plurality of" should be deleted.
    Lines 21-22 should be deleted.
    Line 42, "fier;" should read --fier-- and close up right margin.
    Line 43, "(c)" should be deleted.

COLUMN 6

Line 22, "fier;" should read --fier-- and close up right margin.
    Line 23, "(c)" should be deleted.
    Line 63, "an" should read --a--.

COLUMN 7

Line 16, "fier;" should read --fier-- and close up right margin.
    Line 17, "(c)" should be deleted.

UNITED STATES PATENT AND TRADEMARK OFFICE
CERTIFICATE OF CORRECTION

PATENT NO.  : 5,337,201
DATED       : August 9, 1994
INVENTOR(S) : EIJI OYAMA

It is certified that error appears in the above-identified patent and that said Letters Patent is hereby corrected as shown below:

COLUMN 8

Line 21, Insert Claim 13:
--13. An apparatus according to claim 9, wherein said plurality of magnetic head groups includes two magnetic head groups, each group including two magnetic heads.--.

Signed and Sealed this

Eleventh Day of April, 1995

Attest:

BRUCE LEHMAN

Attesting Officer

Commissioner of Patents and Trademarks